(12) United States Patent
Takeguchi et al.

(10) Patent No.: US 8,865,396 B2
(45) Date of Patent: Oct. 21, 2014

(54) DEVELOPING METHOD AND DEVELOPING APPARATUS

(75) Inventors: Hirofumi Takeguchi, Koshi (JP); Taro Yamamoto, Koshi (JP); Kousuke Yoshihara, Koshi (JP)

(73) Assignee: Tokyo Electron Limited, Minato-Ku (JP)

(*) Notice: Subject to any disclaimer, the term of this patent is extended or adjusted under 35 U.S.C. 154(b) by 1153 days.

(21) Appl. No.: 12/472,728

(22) Filed: May 27, 2009

(65) Prior Publication Data

US 2009/0311632 A1 Dec. 17, 2009

(30) Foreign Application Priority Data

Jun. 17, 2008 (JP) ................... 2008-157560

(51) Int. Cl.
  *G03C 5/18* (2006.01)
  *G03C 5/26* (2006.01)
  *G03F 7/30* (2006.01)

(52) U.S. Cl.
  CPC .................... *G03F 7/3021* (2013.01)
  USPC ........... 430/399; 430/401; 430/423; 430/432; 430/434

(58) Field of Classification Search
  CPC ............... G03F 1/00; G03F 2007/00
  USPC .................... 430/331; 396/590–620
  See application file for complete search history.

(56) References Cited

U.S. PATENT DOCUMENTS

| | | | |
|---|---|---|---|
| 6,634,806 B2 | 10/2003 | Toshima et al. | |
| 2001/0024767 A1 | 9/2001 | Toshima et al. | |
| 2004/0042790 A1 | 3/2004 | Toshima et al. | |
| 2004/0187896 A1* | 9/2004 | Konishi et al. | 134/33 |
| 2005/0069821 A1* | 3/2005 | Kulp | 430/434 |
| 2007/0059640 A1 | 3/2007 | Sanada et al. | |
| 2009/0033898 A1* | 2/2009 | Yamamoto et al. | 355/53 |
| 2009/0130614 A1* | 5/2009 | Ookouchi et al. | 430/434 |

FOREIGN PATENT DOCUMENTS

| | | |
|---|---|---|
| EP | 1 708 252 A1 | 10/2006 |
| EP | 1708252 A1 * | 10/2006 |
| JP | 2001-284206 A1 | 10/2001 |
| JP | 2005-210059 A1 | 8/2005 |
| JP | 2005-251908 A1 | 9/2005 |
| JP | 2007-081176 A1 | 3/2007 |

OTHER PUBLICATIONS

Hydrofluorous acid physical properties, Solvay Specialty Chemicals, 2005.*

* cited by examiner

*Primary Examiner* — Chanceity Robinson
(74) *Attorney, Agent, or Firm* — Burr & Brown, PLLC

(57) ABSTRACT

A developing method including a developing step in which, while a wafer horizontally held by a spin chuck is being rotated, the wafer is developed by supplying a developer onto a surface of the wafer, wherein provided before the developing step is a pre-wetting step in which, simultaneously with the developer being supplied from a first nozzle that is located on a position near a central part of the surface of the rotating wafer, a deionized water as a second liquid is supplied from a second nozzle that is located on a position nearer to an outer peripheral part of the wafer than the first nozzle, to thereby spread out the developer in the rotating direction of the wafer by a wall that is formed by the deionized water flowing to the outer peripheral side of the wafer with the rotation of the wafer.

13 Claims, 7 Drawing Sheets

DEVELOPING METHOD AND DEVELOPING APPARATUS

CROSS REFERENCE TO RELATED APPLICATIONS

This application is based upon and claims the benefit of priority from the prior Japanese Patent Application No. 2008-157560 filed on Jun. 17, 2008, the entire contents of which are incorporated herein by reference.

FIELD OF THE INVENTION

The present invention relates to a developing method and a developing apparatus configured to develop a substrate whose surface has been coated with a resist and exposed.

BACKGROUND OF THE INVENTION

In general, when a semiconductor device is manufactured, a photoresist is coated on a substrate such as a semiconductor wafer, the thus formed resist film is exposed in accordance with a predetermined circuit pattern, and the exposed pattern is developed so as to form a circuit pattern in the resist film.

In this photolithographic step, there is generally used a system in which an exposure apparatus is connected to a coating and developing apparatus for coating and developing a resist.

As a conventional developing apparatus, there has been known, for example, a rotational developing paddle type in which a developer is supplied to a substrate which is being rotated, the developer is spread out over all the substrate, a developer is then supplied from a part near a center of the substrate while the rotational speed of the substrate is decreased, and a developer film (paddle) is formed by the accumulated developer.

In such a developing apparatus, there has been known a method in which a deionized water is supplied to a surface of a substrate before the developing process, in order to improve a wetting property (see, for example, JP2005-210059A).

Meanwhile, in order to cope with further miniaturization of a device pattern and further thinning of a film, there is an ongoing demand for raising a resolution of exposure. As one of the methods for raising the resolution of exposure, there is known an immersion exposure method in which a substrate is exposed with a light-transmittable liquid layer being formed on a surface of the substrate, in order to raise the resolution by improving an exposure technique by an existing light source such as argon fluoride (ArF) light source. In this immersion exposure technique, under the condition that a liquid film of a deionized water is formed between a lens and a surface of a substrate, a light ray emitted from the light source passes through the lens and transmits the liquid film so as to be irradiated on the substrate, whereby a predetermined resist pattern (circuit pattern) is transferred to the resist.

In the liquid exposure technique, a highly water-repellent resist (non-topcoat resist) is sometimes used, or a highly water-repellent protective film (upper protective film) is sometimes used on a resist. In order that a deionized water is stabilized lest droplets of the deionized water remain on a substrate so as to improve a productivity, there is used the non-topcoat resist that does not require the upper protective film.

SUMMARY OF THE INVENTION

For example, since the non-topcoat resist is highly hydrophobic, even when a deionized water is supplied to a substrate surface before the developing process by using the technique described in JP2005-210059A, a surface of the resist film cannot obtain a sufficient wetting property. As a result, the developer on the substrate is repelled and spun off. Thus, there is a problem in that it is difficult to form a developer film (paddle) on the substrate surface even when a supply amount of the developer is increased.

The present invention has been made in view of the above circumstances. The object of the present invention is to provide a developing method and a developing apparatus capable efficiently forming a developer film and thus stabilizing a developing process, by improving a wetting property of a surface of a resist film formed on a substrate that is made hydrophobic.

In order to solve the above problem, the developing method of the present invention is a developing method comprising a developing step in which, while a horizontally held substrate is being rotated, the substrate is developed by supplying a developer onto a surface of the substrate, wherein provided before the developing step is a pre-wetting step in which, simultaneously with the developer being supplied from a first nozzle that is located on a position near a central part of the surface of the rotating substrate, a second liquid is supplied from a second nozzle that is located on a position nearer to an outer peripheral part of the substrate than the first nozzle, to thereby spread out the developer in the rotating direction of the substrate by a wall that is formed by the second liquid flowing to the outer peripheral side of the substrate with the rotation of the substrate.

In addition, the present invention is a developing method comprising a developing step in which, while a horizontally held substrate is being rotated, the substrate is developed by supplying a developer onto a surface of the substrate, wherein provided before the developing step is a pre-wetting step in which, simultaneously with the developer being supplied from a first nozzle that is located on a position near a central part of the surface of the rotating substrate, a second liquid is supplied from a second nozzle that is located on a position nearer to an outer peripheral part of the substrate than the first nozzle, and the first nozzle and the second nozzle are moved in a direction connecting the central part and the outer peripheral part of the substrate, to thereby spread out the developer in the rotating direction of the substrate by a wall that is formed by the second liquid flowing to the outer peripheral side of the substrate with the rotation of the substrate.

In this invention, the second liquid is a deionized water. A surface tension value of the developer is larger than that of the second liquid. A specific gravity of the developer is larger than that of the second liquid. A viscosity of the developer is larger than that of the second liquid.

In the developing method of this invention, it is preferable that a rotational speed of the substrate is between 250 rpm and 3000 rpm.

This is because, when the rotational speed of the substrate is smaller than 250 rpm, the liquids (developer and deionized water) may not be sufficiently spread out, and when the rotational speed of the substrate is larger than 3000 rpm, the liquid may be scattered on the outer peripheral side whereby a pre-wetting film cannot be formed.

In the developing method of this invention, it is preferable that before the developer and the second liquid are simultaneously supplied, there is provided a step in which the second nozzle is moved to a position above the central part of the substrate, and the second liquid is supplied onto the substrate surface.

In addition, a developing apparatus of this invention is a developing apparatus configured to rotate a horizontally held substrate, and to develop the substrate by supplying a developer onto a surface of the substrate, the developing apparatus comprising: a substrate holding means configured to horizontally hold the substrate; a rotating mechanism configured to rotate the substrate in a horizontal plane; a first nozzle configured to supply the developer onto the substrate surface, while the substrate is being rotated by the rotating mechanism; a second nozzle configured to supply a second liquid onto the substrate surface, the second nozzle being located on a position nearer to an outer peripheral part of the substrate than the first nozzle; and a control means configured to control the rotating mechanism, the first nozzle, and the second nozzle; wherein, before a developing step in which the developer is supplied to the substrate, the control means drives the rotating mechanism so as to rotate the substrate, and performs a pre-wetting process in which, simultaneously with the developer being supplied from the first nozzle that is located on a position near a central part of the surface of the substrate, the second liquid is supplied from the second nozzle that is located on a position nearer to the outer peripheral part of the substrate than the first nozzle, to thereby spread out the developer in the rotating direction of the substrate by a wall that is formed by the second liquid flowing to the outer peripheral side of the substrate with the rotation of the substrate.

In addition, the present invention is a developing apparatus configured to rotate a horizontally held substrate, and to develop the substrate by supplying a developer onto a surface of the substrate, the developing apparatus comprising: a substrate holding means configured to horizontally hold the substrate; a rotating mechanism configured to rotate the substrate in a horizontal plane; a first nozzle configured to supply a developer onto the substrate surface, while the substrate is being rotated by the rotating mechanism; a second nozzle configured to supply a second liquid onto the substrate surface, the second nozzle being located on a position nearer to an outer peripheral part of the substrate than the first nozzle; a nozzle moving mechanism configured to move the first nozzle and the second nozzle in a direction connecting the central part and the outer peripheral part of the substrate; and a control means configured to control the rotating mechanism, the nozzle moving mechanism, the first nozzle, and the second nozzle; wherein, before a developing step in which the developer is supplied to the substrate, the control means drives the rotating mechanism so as to rotate the substrate, and performs a pre-wetting process in which, simultaneously with the developer being supplied from the first nozzle that is located on a position near a central part of the surface of the substrate, the second liquid is supplied from the second nozzle that is located on a position nearer to the outer peripheral part of the substrate than the first nozzle, and drives the nozzle moving mechanism so as to move the first nozzle and the second nozzle in a direction connecting the central part and the outer peripheral part of the substrate, to thereby spread out the developer in the rotating direction of the substrate by a wall that is formed by the second liquid flowing to the outer peripheral side of the substrate with the rotation of the substrate.

In the developing apparatus of this invention, the second liquid is a deionized water. In addition, it is preferable that a rotational speed of the substrate rotated by the rotating mechanism is between 250 rpm and 3000 rpm.

In addition, it is preferable that before the first nozzle and the second nozzle are moved and the developer and the second liquid are simultaneously supplied, the control means moves the second nozzle to a position above the central part of the substrate so as to supply the second liquid onto the substrate surface.

According to the present invention, before the developing process, simultaneously with the developer being supplied from the first nozzle that is located on a position near the central part of the surface of the rotating substrate, the second liquid is supplied from the second nozzle that is located on a position nearer to the outer peripheral part of the substrate than the first nozzle, to thereby spread out the developer in the rotating direction of the substrate by a wall that is formed by the second liquid flowing to the outer peripheral side of the substrate with the rotation of the substrate. Thus, the developer can be uniformly spread out on the substrate surface, and a wetting property of the substrate surface can be enhanced.

According to the present invention, before the developing process, the first nozzle and the second nozzle are moved in a direction connecting the central part and the outer peripheral part of the substrate, to thereby spread out the developer in the rotating direction of the substrate by a wall that is formed by the second liquid flowing the outer peripheral side of the substrate with the rotation of the substrate. Thus, the developer can be uniformly spread out on the substrate surface, and a wetting property of the substrate surface can be enhanced.

In addition, according to the present invention, before the developer and the second liquid are simultaneously supplied, the second nozzle is moved to a position above the central part of the substrate so as to supply the second liquid onto the substrate surface. Thus, an adhering property of the developer to the substrate can be improved at an initial stage of the pre-wetting step.

According to the present invention, due to the above structure, the wetting property of a surface of a resist film formed on the substrate that is made hydrophobic can be improved, whereby a developer film can be efficiently formed and thus the developing process can be stabilized.

DETAILED DESCRIPTION OF THE INVENTION

One embodiment of this invention is described herebelow with reference to the accompanying drawings.

Figure 1:
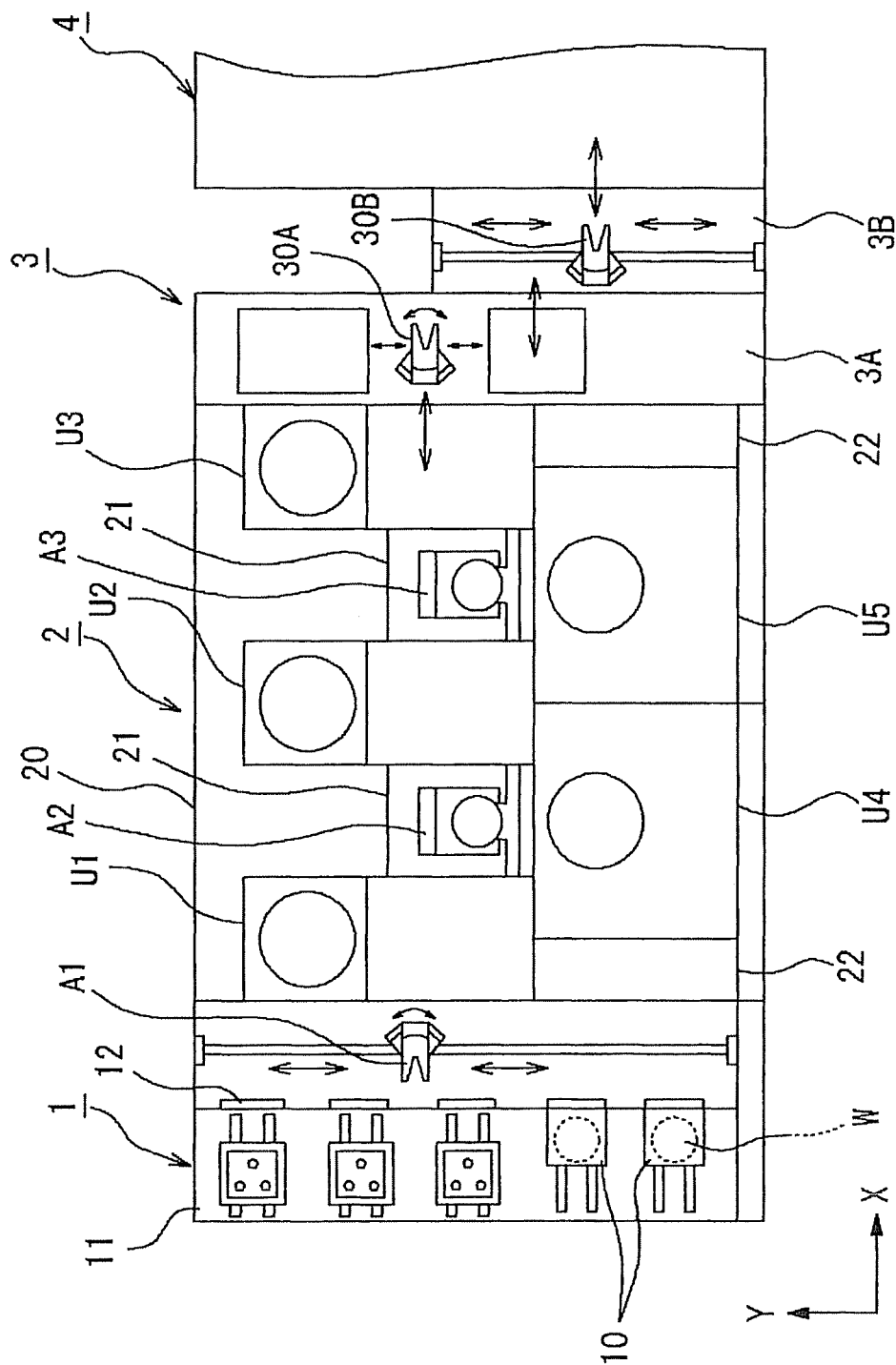
FIG. 1 is a schematic plan view showing a process system as a whole in which an exposure apparatus is connected to a coating and developing apparatus to which a developing apparatus according to the present invention is applied.
Figure 2:
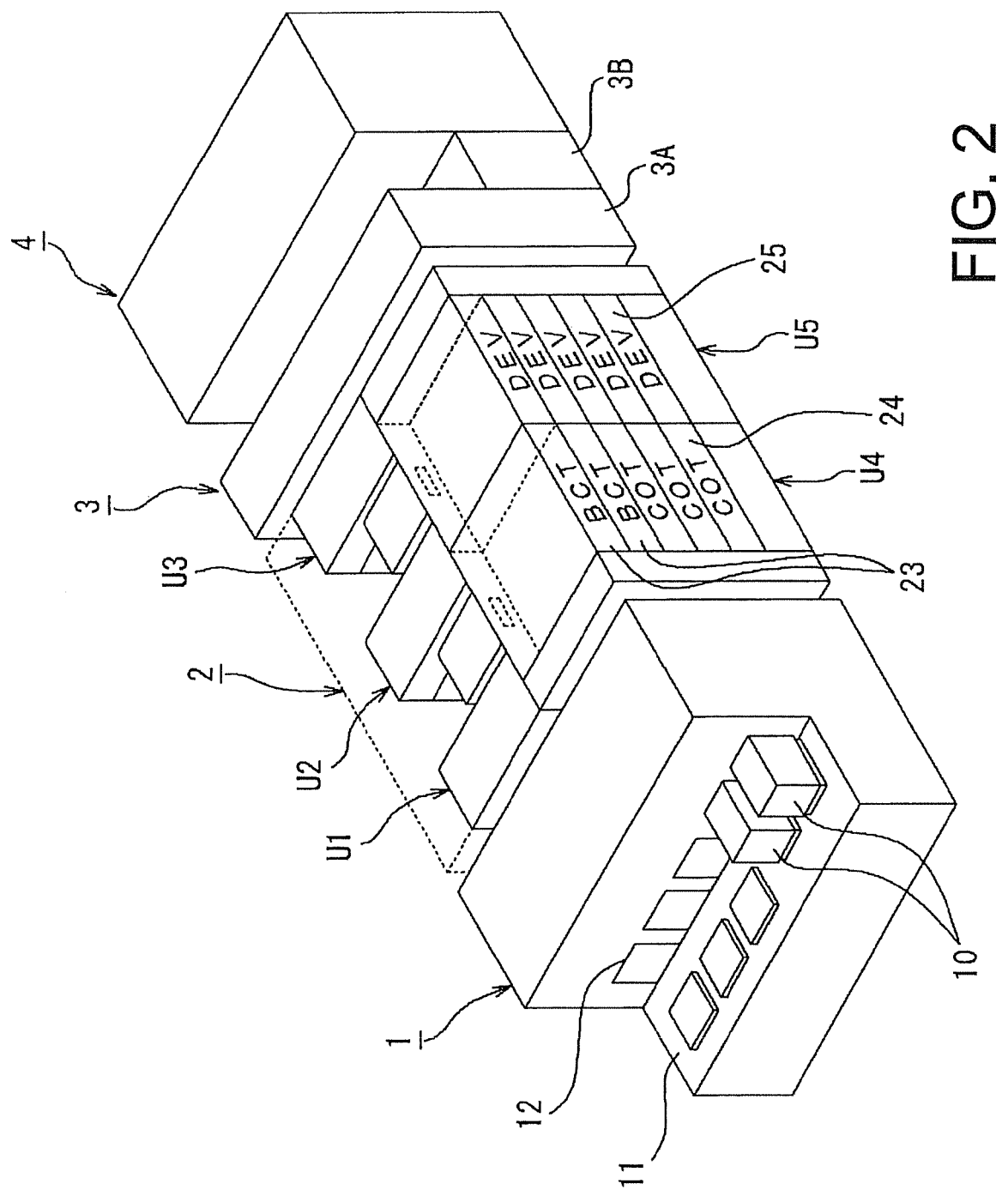
FIG. 2 is a schematic perspective view of the processing system.

FIG. 1 is a schematic plan view showing a process system as a whole in which an exposure apparatus is connected to a coating and developing apparatus to which a developing apparatus according to the present invention is applied. FIG. 2 is a schematic perspective view of the processing system.

The processing system includes: a carrier station 1 for loading and unloading a carrier 10 capable of hermetically containing a plurality of, e.g., twenty-five semiconductor wafers W (hereinafter simply referred to as "wafer") as substrates to be processed; a processing part 2 for coating a resist on a wafer W and develop the wafer W that is taken out from the carrier station 1; an exposure part 4 for immersion-exposing a surface of the wafer W, with a light-transmittable liquid layer being formed on the surface of the wafer W; and an interface part 3 connected between the processing part 2 and the exposure part 4 so that the wafer W is transferred therebetween.

The carrier station 1 includes: a stage 11 on which a plurality of carriers 10 can be placed in a line; an opening and closing part 12 formed in a front wall surface when viewed from the stage 11; and a conveying means A1 for taking out a wafer W from the carrier 10 through the opening and closing part 12.

The interface part 3 is composed of a first transfer chamber 3A and a second transfer chamber 3B that are interposed between the processing part 2 and the exposure part 4 in a back and forth direction. The first transfer chamber 3A and the second transfer chamber 3B are respectively provided with a first wafer transfer part 30A and a second wafer transfer part 30B.

The processing part 2 whose circumference is surrounded by a housing 20 is connected to a rear side of the carrier station 1. The processing part 2 is provided with, in an alternating arrangement manner, shelf units U1, U2 and U3 in which heating units and cooling units are arranged in a tier-like manner, liquid processing units U4 and U5, and main transfer means A2 and A3 for transferring a wafer W between the respective units, in this order from the front. The main transfer means A2 and A3 are located in a space surrounded by a partition wall 21 including one surface part on a side of the shelf units U1, U2, and U3 that are arranged in the back and forth direction when viewed from the carrier station 1, one surface part on a side of, e.g., the right-side liquid processing units U4 and U5 which are described below, and a rear surface part as a left-side surface. Disposed between the carrier station 1 and the processing part 2 and between the processing part 2 and the interface part 3 are temperature-and-humidity adjusting units 22 each having a temperature adjusting apparatus and a duct for adjusting a temperature and a humidity of a process liquid used in the respective units.

The shelf units U1, U2 and U3 are structured by stacking, at a plurality of, e.g., ten levels, various units for performing a preprocess and a postprocess for a process performed by the liquid processing units U4 and U5. Combinations of the various units include a heating unit (HP) for heating (baking) a wafer W and a cooling unit (CPL) for cooling a wafer W. As shown in FIG. 2, the liquid processing units U4 and U5 are structured by stacking, at a plurality of, e.g., five levels, a bottom anti-reflection film coating unit (BCT) 23 for coating an anti-reflection film on a chemical-liquid containing part such as a resist and a developer, a coating unit (COT) 24, and a developing unit (DEV) for supplying a developer to a wafer W so as to develop the same, for example. A developing apparatus 50 according to this invention is disposed in the developing unit (DEV) 25.

Figure 3:
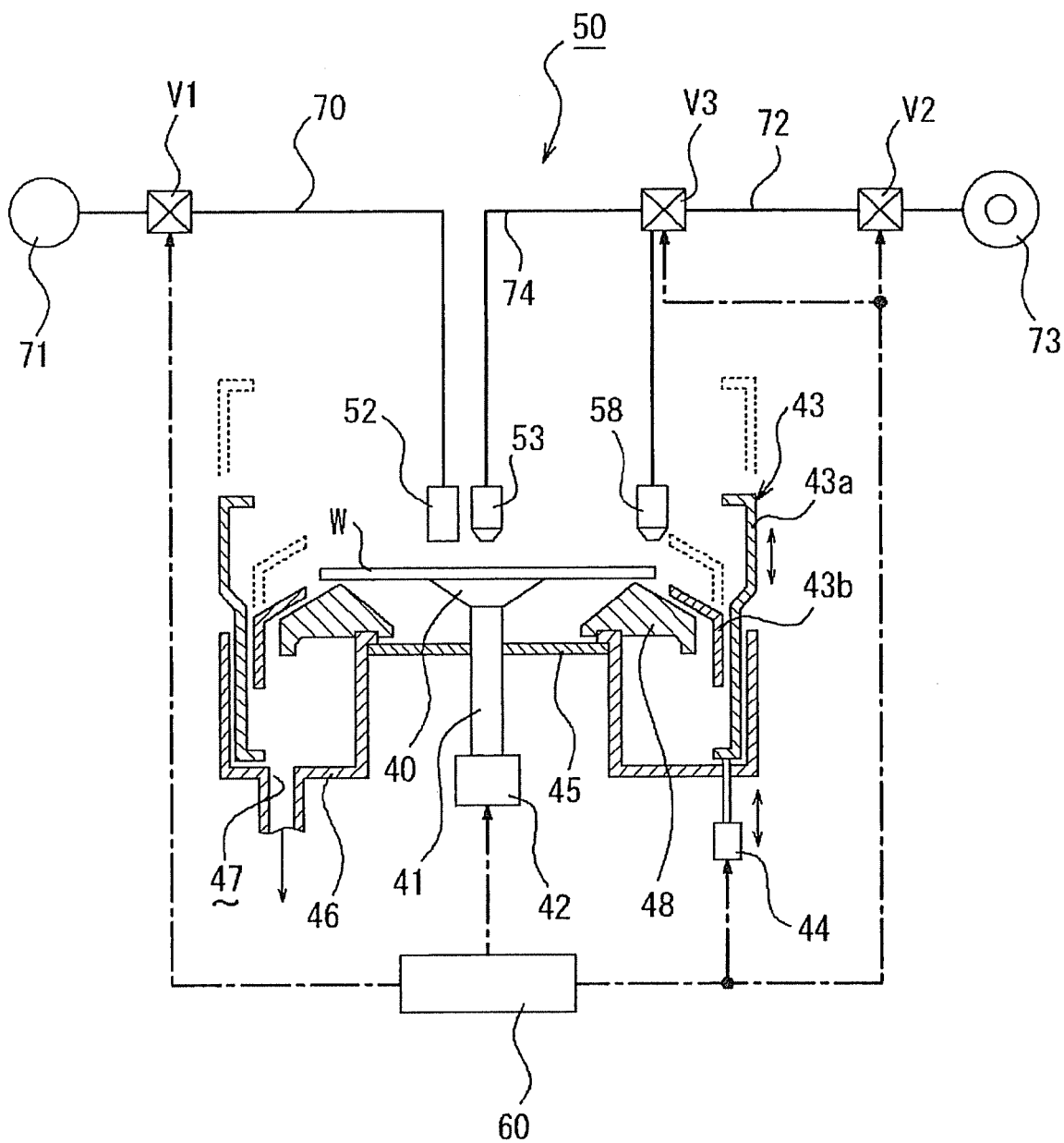
FIG. 3 is a schematic sectional view showing the developing apparatus according to the present invention.
Figure 4:
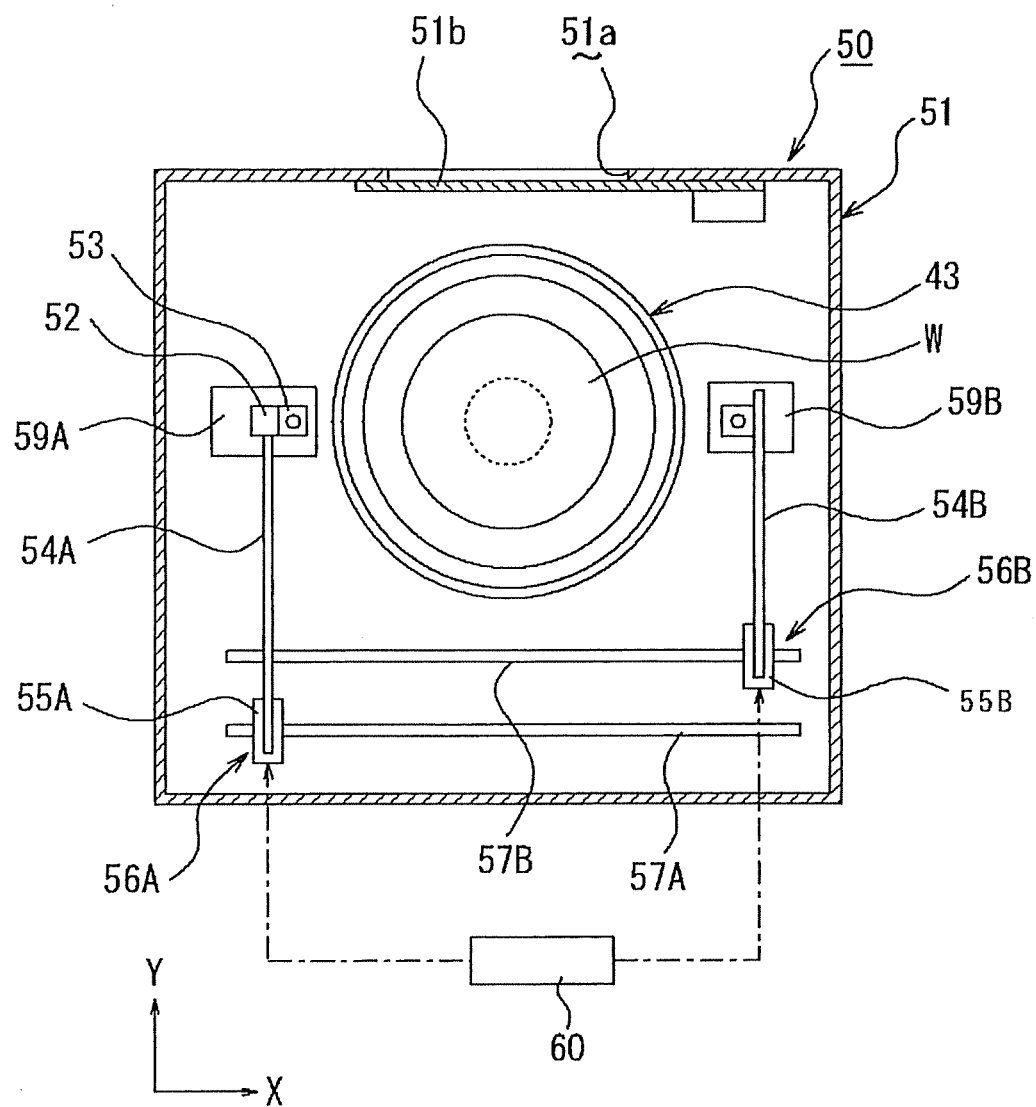
FIG. 4 is a schematic plan view showing the developing apparatus.

As shown in FIGS. 3 and 4, the developing apparatus 50 includes a spin chuck 40 disposed in a casing 51 having a loading and unloading port 51a for a wafer W. The spin chuck 40 serves as a substrate holding means for horizontally holds a wafer W by absorbing a central part of a rear surface of the wafer W. The loading and unloading port 51a is equipped with a shutter 51b that can be opened and closed.

The spin chuck 40 is coupled to, e.g., a rotating mechanism 42 such as a servomotor through a shaft part 41. Due to the rotating mechanism 42, the spin chuck 40 can be rotated while holding a wafer W. The rotating mechanism 42 is electrically connected to a controller 60 as a control means, so that a rotational speed of the spin chuck 40 can be controlled based on a control signal from the controller 60.

A cup 43 is disposed so as to surround a lateral side of a wafer W held by the spin chuck 40. The cup 43 is composed of a cylindrical outer cup 43a and a tubular inner cup 43b whose upper part is inclined inward. The outer cup 43a can be moved in an up and down direction by an elevating mechanism 44 such as a cylinder connected to a lower end of the outer cup 43a, and the inner cup 43b can be moved in the up and down direction by being pushed up by a stepped part formed on an inner circumferential surface on a lower end side of the outer cup 43a. The elevating mechanism 44 is electrically connected to the controller 60, so that the outer cup 43a can be moved in the up and down direction based on a control signal from the controller 60.

A circular plate 45 is disposed below the spin chuck 40. A liquid receiving part 46 having a recessed cross-section is disposed outside the circular plate 45 to surround the same. A drain outlet port 47 is formed in a bottom surface of the liquid receiving part 46, so that a developer and a rinse liquid, which drop or spin off from the wafer W and stored in the liquid receiving part 46, can be discharged outside the apparatus through the drain outlet port 47. A ring member 48 having a chevron-like cross-section is disposed outside the circular plate 45. Although not shown, a plurality of, e.g., three elevating pins as substrate supporting pins are disposed to pass through the circular plate 45. Owing to a cooperation of the elevating pins and a not-shown substrate transfer means, a wafer W can be transferred to the spin chuck 40.

On the other hand, disposed above the wafer W held by the spin chuck 40 are: a first developer supply nozzle 52 (hereinafter referred to as "developer nozzle 52") capable of being moved in the up and down direction and moved in the horizontal direction, the developer nozzle 52 being opposed to a central part of a front surface of the wafer W with a gap between the developer nozzle 52 and the wafer W; and a second pre-wetting deionized-water nozzle 53 (hereinafter referred to as "deionized-water nozzle 53") that is located on a position nearer to an outer peripheral part of the wafer W than the developer nozzle 52, the deionized-water nozzle 53 being configured to supply a second liquid such as a deionized water to the front surface of the wafer W.

The developer nozzle 52 is equipped with a slit-like spout (not shown) for discharging (supplying) a developer in a strip-like manner. The spout is located such that a length direction thereof is oriented from the central part toward the outer peripheral part of the wafer W, for example. Not limited to the spout that is extended along a straight line (radius) oriented from the central part toward the outer peripheral part of the wafer W, the spout may intersect the straight line at a slight angle.

The developer nozzle 52 and the deionized-water nozzle 53 are supported on one end of a nozzle arm 54A. The other end of the nozzle arm 54A is coupled to a movable table 55A having a not-shown elevating mechanism. The movable table 55A is configured to be laterally movable along a guide member 57A extending in an X direction, by means of a nozzle moving mechanism 56A such as a ball screw and a timing belt. Due to this structure, when the nozzle moving mechanism 56A is driven, the developer nozzle 52 and the deionized-water nozzle 53 are moved along the straight line (radius) oriented from the central part toward the outer peripheral part of the wafer W.

Disposed on one outside part of the cup 43 is a standby part 59A for the developer nozzle 52 and the deionized-water nozzle 53. The standby part 59A cleans a nozzle end of the developer nozzle 52, for example.

In addition, disposed above the wafer W held by the spin chuck 40 is a rinse nozzle 58 for discharging (supplying) a rinse liquid such as deionized water, the rinse nozzle 58 being opposed to the central part of the front surface of the wafer W with a gap between the rinse nozzle 58 and the wafer W. The rinse nozzle 58 is capable of being moved in the up and down direction and moved in the horizontal direction.

The rinse nozzle 58 is supported on one end of a nozzle arm 54B. The other end of the nozzle arm 54B is coupled to a movable table 55B having a not-shown elevating mechanism. The movable table 55B is configured to be laterally movable along a guide member 57B extending in the X direction, by means of a nozzle moving mechanism 56B such as a ball screw and a timing belt. Disposed on the other outside part of the cup 43 is a standby part 59B for the rinse nozzle 58.

The developer nozzle 52 is connected to a developer supply source 71 through a developer supply duct 70 in which an opening and closing valve V1 is disposed. The deionized-water nozzle 53 is connected to a branch duct 74. The branch duct 74 is connected via a switching valve V3 to a deionized-water supply duct 72 connecting the rinse nozzle 58 and a deionized-water supply source 73. An opening and closing valve V2 is disposed in the deionized-water supply duct 72.

The nozzle moving mechanisms 56A and 56B, the opening and closing valves V1 and V2, and the switching valve V3 are respectively electrically connected to the controller 60, so that the developer nozzle 52 and the deionized-water nozzle 53 can be horizontally moved, the rinse nozzle 58 can be horizontally moved. the opening and closing valves V1 and V2 can be driven to be opened and closed, and the switching valve V3 can be driven to be switched, based on a control signal previously stored in the controller 60.

Figure 5:
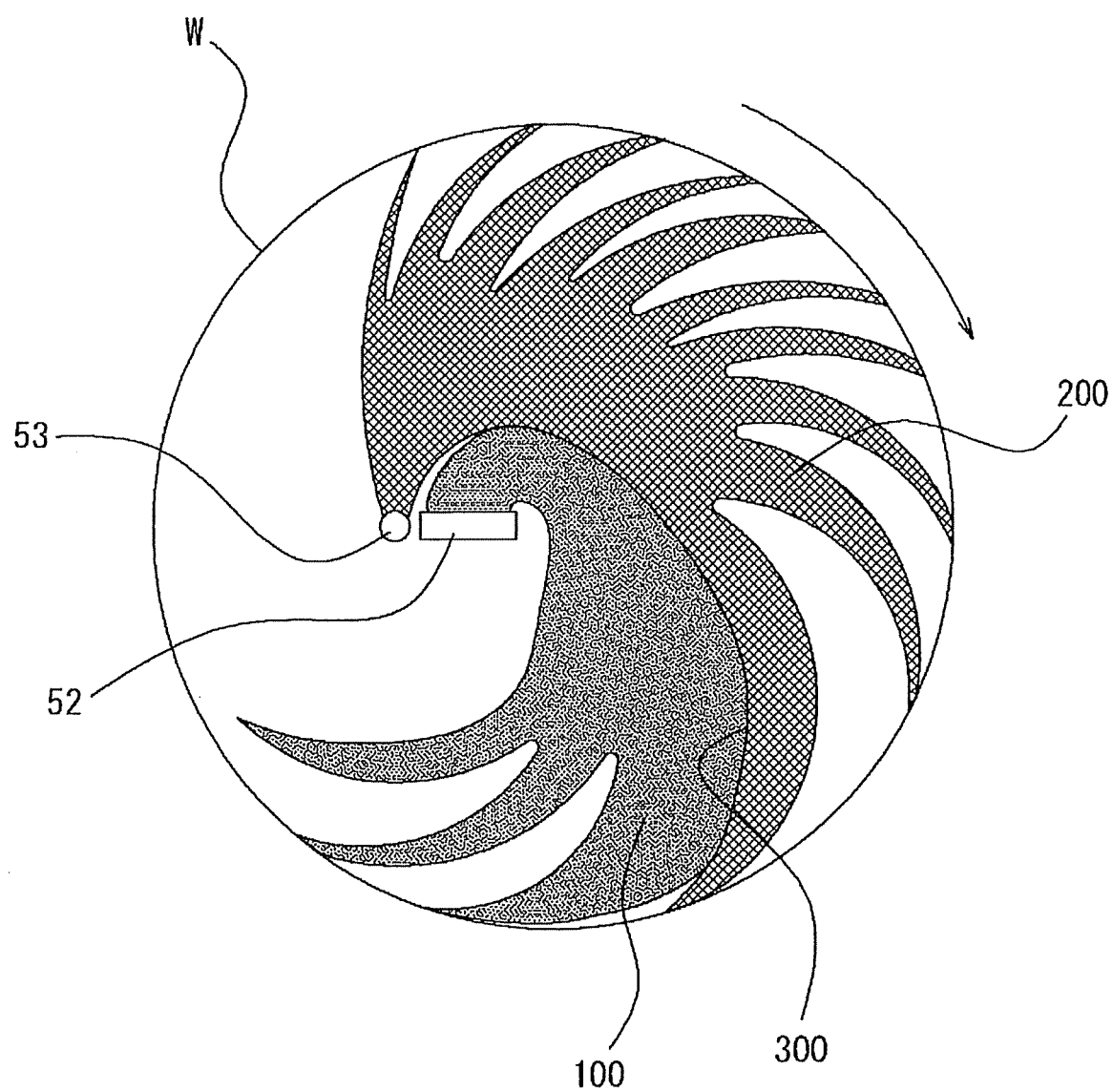
FIG. 5 is a schematic plan view showing a principle of a pre-wetting process in this invention.

By means of the control of the controller 60, a pre-wetting process can be performed before a developing process in which a developer is supplied to a wafer W. Namely, as shown in FIG. 5, there is performed the pre-wetting process in which, simultaneously with a developer 100 being discharged (supplied) from the developer nozzle 52 that is located on a position near a central part of a front surface of a wafer W that is being rotated by driving the rotating mechanism 42, a deionized water 200 is discharged (supplied) from the deionized-water nozzle 53 that is located on a position nearer to an outer peripheral part of the wafer W than the developer nozzle 52, to thereby spread out the developer 100 in the rotating direction of the wafer W by a wall 300 that is formed by the deionized water 200 flowing to the outer peripheral side of the wafer W with the rotation of the wafer W.

Figure 6:
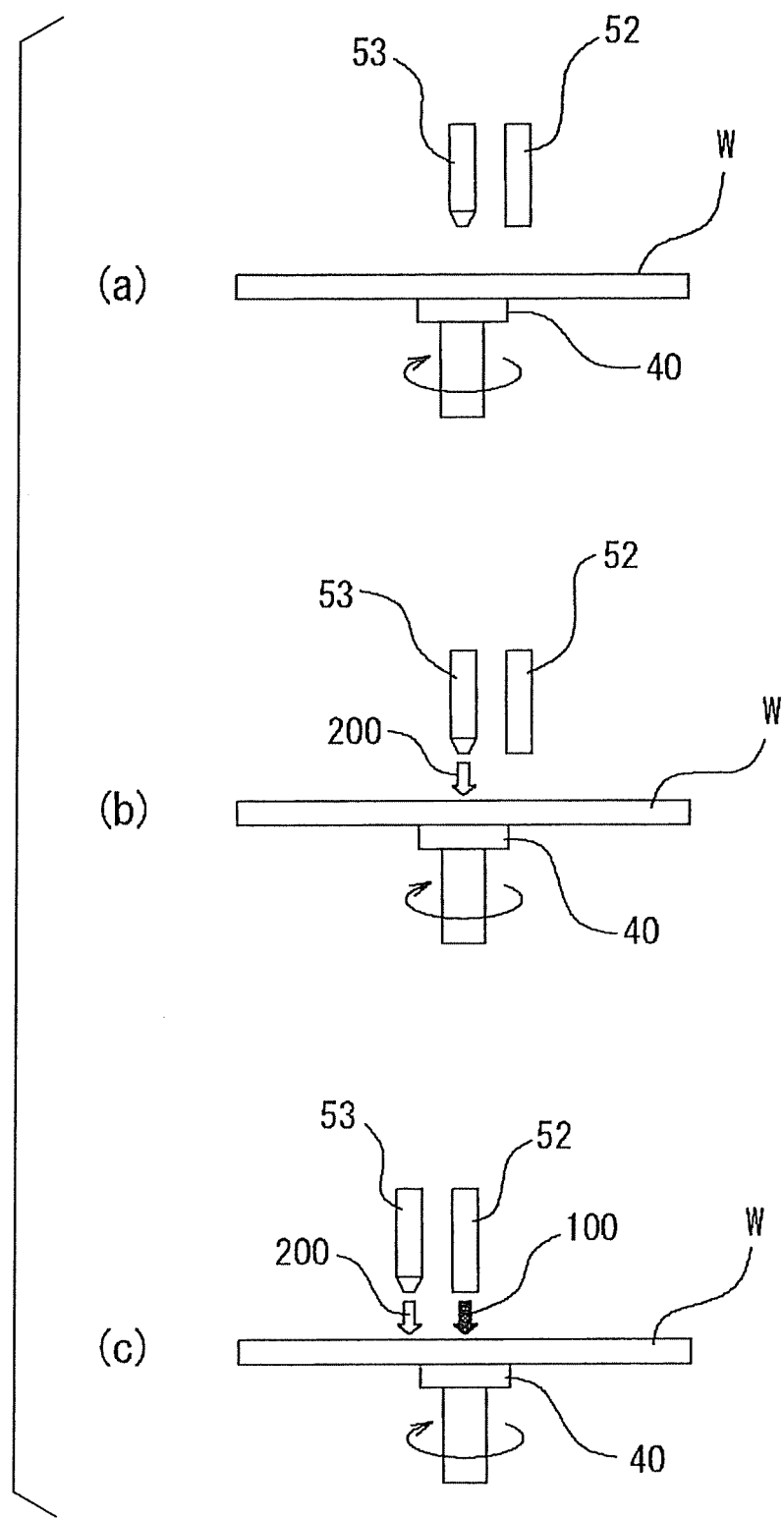
FIG. 6 is a view for explaining a first embodiment of the pre-wetting step in this invention.

Next, the pre-wetting process is concretely described with reference to FIGS. 6 and 7. FIG. 6 is a view for explaining a first embodiment of the pre-wetting step. In the first embodiment, the rotating mechanism 42 is firstly driven to rotate a wafer W. At this time, a rotational speed of the wafer W is within a range between 250 rpm and 3000 rpm, e.g., at 1500 rpm. While the wafer W is being rotated, the nozzle moving mechanism 56A is driven so as to move the deionized-water nozzle 53 to a position above a central part of the wafer W (see, FIG. 6(a)). Then, a deionized water 200 is discharged (supplied) from the deionized-water nozzle 53 onto the central part of the wafer surface. (see, FIG. 6(b)). Thus, an adhering property of a developer to the wafer W can be improved at an initial stage of the pre-wetting step. Following thereto, the nozzle moving mechanism 56A is driven so as to move the developer nozzle 52 to the position above the central part of the wafer W, and a developer 100 is discharged (supplied) from the developer nozzle 52 onto the central part of the wafer surface (see, FIG. 6(c)). Under this condition, as described above, since the deionized water 200 is also discharged (supplied) from the deionized-water nozzle 53 that is located on a position nearer to the outer peripheral part of the wafer W than the developer nozzle 52, there can be performed the pre-wetting process in which the developer 100 is spread out in the rotating direction of the wafer W by a wall 300 that is formed by the deionized water 200 flowing to the outer peripheral side of the wafer W with the rotation of the wafer W (see, FIG. 5).

Figure 7:
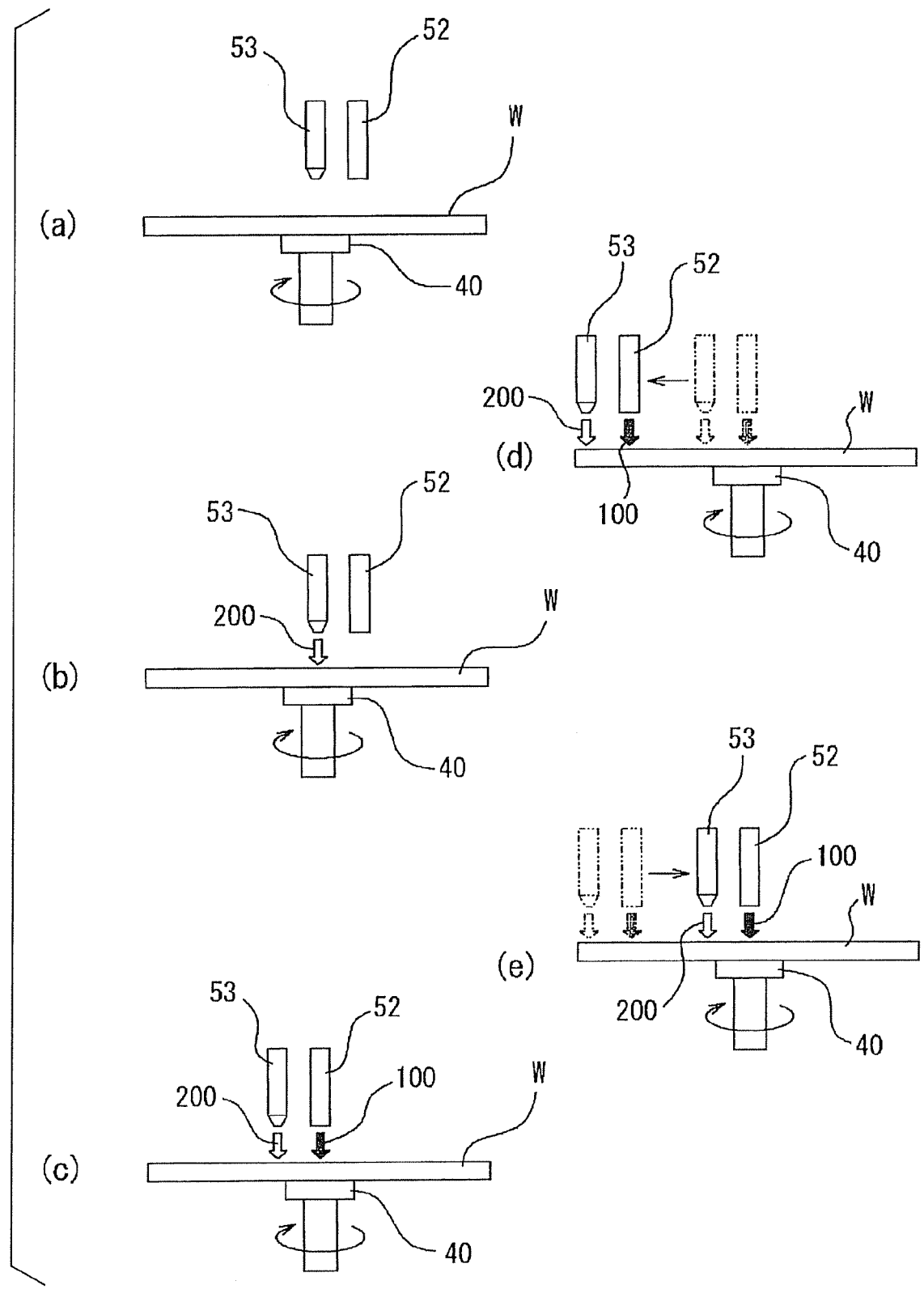
FIG. 7 is a view for explaining a second embodiment of the pre-wetting step in this invention.

FIG. 7 is a view for explaining a second embodiment of the pre-wetting step. In the second embodiment, similarly to the first embodiment, the rotating mechanism 42 is firstly rotated to rotate a wafer W. Then, while the wafer W is being rotated, the nozzle moving mechanism 56A is driven so as to move the deionized-water nozzle 53 to a position above a central part of the wafer W (see, FIG. 7(a)). Then, a deionized water 200 is discharged (supplied) from the deionized-water nozzle 53 onto the central part of the wafer surface (see, FIG. 7(b)). Following thereto, the nozzle moving mechanism 56A is driven so as to move the developer nozzle 52 to the position above the central part of the wafer W, and a developer 100 is discharged (supplied) from the developer nozzle 52 onto the central part of the wafer surface (see, FIG. 7(c)). Under this condition, the deionized water 200 is also discharged (supplied) from the deionized-water nozzle 53 that is located on a position nearer to the outer peripheral part of the wafer W than the developer nozzle 52. Under this condition, the nozzle moving mechanism 56A is moved so as to move the developer nozzle 52 and the deionized-water nozzle 53 along a straight line (radius) oriented from the central part toward the outer peripheral part of the wafer W (see, FIG. 7(b)). Thus, as described above, there can be performed the pre-wetting process in which the developer 100 is spread out in the rotating direction of the wafer W by a wall 300 that is formed by the deionized water 200 flowing to the outer peripheral side of the wafer W with the rotation of the wafer W (see, FIG. 5). After the developer nozzle 52 and the deionized-water 53 have been moved to the outer peripheral side of the wafer W, the developer nozzle 52 and the deionized-water nozzle 53 may be moved along the straight line (radius) oriented from the outer peripheral part toward the central part of the wafer W, while the developer 100 and the deionized water 200 are being discharged (supplied) (see, FIG. 7(e)).

In the above embodiments, a surface tension value of the developer 100 is larger than that of the deionized water 200 used as the second liquid. In addition, since the developer 100 has a larger specific gravity and a larger viscosity than those of the deionized water 200, the wetting property of the wafer surface can be enhanced.

It is possible to use a liquid other than a deionized water as the second liquid. However, it is preferable that such a liquid has the aforementioned properties, i.e., a smaller surface tension value, a smaller specific gravity, and a smaller viscosity than those of a developer.

After the pre-wetting process has been performed, a series of processes such as a developing liquid, a rinse process, and a drying process are performed in this order. Namely, the developing process is performed such that the nozzle moving mechanism 56A is moved so as to move the developer nozzle 52 to the position above the central part of the wafer surface, and the developer nozzle 52 is moved along the straight line (radius) oriented from the central part toward the outer peripheral part of the wafer W, while the developer 100 is being discharged (supplied) onto the surface of the rotating wafer W. After the developing process, the rinse process for rinsing the wafer surface is performed such that the nozzle moving mechanism 56B is moved so as to move the rinse nozzle 58 to the position above the central part of the wafer surface, and a rinse liquid, i.e., a deionized water is discharged (supplied) from the rinse nozzle 58 onto the surface of the rotating wafer W so as to rinse away the developer containing a resist soluble component remaining on the wafer surface. After the rinse process, the spin-drying process is performed such that the rotating mechanism 42 is driven to rotate the wafer W at a high rotational speed such as 200 rpm, whereby the liquid remaining on the wafer surface is spun off.

Next, there is briefly described a procedure for processing a wafer W with the use of the above coating and developing apparatus, with reference to FIGS. 1 and 2. Herein, there is described an example in which a bottom anti-reflection film (BARC) is formed on a surface of a wafer W, and a non-topcoat resist is coated on the bottom anti-reflection film as an upper layer. At first, the carrier 10 accommodating, e.g., twenty-five wafer W is placed on the stage 11. Then, the opening and closing part 12 and a lid of the carrier 10 are opened, and a wafer W is taken out therefrom by the conveying means A1. Then, the wafer W is transferred to the main transfer means A2 via a transfer unit (not shown) as one of the levels of the shelf unit U1, and a bottom anti-reflection film (BARC) is formed on a surface of the wafer W, which is a preprocess of a coating process, in the unit (BCT) 23, for example. Thereafter, the wafer W is transferred by the main transfer means A2 to the heating part as one of the shelves of the shelf units U1 to U3, and the wafer W is pre-baked (CLHP) and then cooled. After that, the wafer W is loaded into the coating unit (COT) 24 by the main transfer means A2, and a non-topcoat resist is coated on the overall surface of the wafer W to form a thin film thereof. Subsequently, the wafer W is transferred by the main transfer means A2 to the heating part as one of the shelves of the shelf units U1 to U3, and the wafer W is pre-baked (CLHP) and then cooled. After that, the wafer W is transferred to the interface part 3 via the transfer unit of the shelf unit U3. In the interface part 3, the wafer W is transferred to the exposure part 4 by the first wafer transfer part 30A of the first chamber 3A and the second transfer part 30B of the second transfer chamber 3B. In the exposure part 4, an exposure means (not shown) is arranged so as to be opposed to the surface of the wafer W, so that an immersion exposure is performed. The wafer W, which has been subjected to the immersion exposure process, is transferred to the main transfer means A3 along a reverse way, and is loaded into the developing unit (DEV) 25. The wafer W, which has been loaded into the developing unit (DEV) 25, is subjected to the above-described pre-wetting process by the developing apparatus 50. Namely, there is performed the pre-wetting process in which, simultaneously with a developer 100 being discharged (supplied) from the developer nozzle 52 that is located on a position near a central part of a front surface of a wafer W that is being rotated by driving the rotating mechanism 42, a deionized water 200 is discharged (supplied) from the deionized-water nozzle 53 that is located on a position nearer to an outer peripheral part of the wafer W than the developer nozzle 52, to thereby spread out the developer 100 in the rotating direction of the wafer W by a wall 300 that is formed by the deionized water 200 flowing the outer peripheral side of the wafer W with the rotation of the wafer W. After the pre-wetting process, the wafer W is subjected to a series of processes such as the developing process, the rinsing process, and the drying process, whereby a predetermined resist pattern can be formed.

After that, the wafer W is unloaded from the developing unit (DEV) 25 by the main transfer means A3, and is returned to the original carrier 10 on the stage 11 via the main transfer means A2 and the conveying means A1. In this manner, a series of coating and developing process is completed.

In the above embodiment, there has been described the example in which the bottom anti-reflection film (BARC) is formed on the surface of the wafer W, and the resist layer is formed on the surface thereof. However, when the bottom anti-reflection film (BARC) is omitted, the same effect as that of the above embodiment can be produced. In this case, the wafer W is subjected to the resist coating step, the pre-baking step, the immersion exposure step, the post-exposure baking step, and the developing step (pre-wetting process, the developing process, the rinsing process, and the drying process) in this order.

In the above embodiment, there has been described the example in which the developing apparatus according to the present invention is applied to the developing process of the wafer W coated with the non-top resist coat. However, this invention may be applied to a developing process of a wafer W which is coated with a general resist other than the non-topcoat resist. Moreover, this invention may be applied to a developing process of a wafer W having a highly water-repellent upper protective film.

The invention claimed is:

1. A developing method comprising a developing step in which, while a horizontally held substrate having a resist film formed thereon is being rotated, the substrate is developed by supplying a developer onto a surface of the substrate, wherein provided before the developing step is a pre-wetting step in which, simultaneously with the developer being supplied from a first nozzle that is located on a position near a central part of the surface of the rotating substrate having a resist film formed thereon, a second liquid is supplied from a second nozzle that is located on a position nearer to an outer peripheral part of the substrate than the first nozzle, to thereby spread out the developer in the rotating direction of the substrate by a wall that is formed by the second liquid flowing to the outer peripheral side of the substrate with the rotation of the substrate, wherein, in the pre-wetting step, the supply of the developer is initiated simultaneously with the supply of the second liquid, and wherein a surface tension value of the developer is larger than that of the second liquid.

2. The developing method according to claim 1, wherein the second liquid is a deionized water.

3. The developing method according to claim 1, wherein a specific gravity of the developer is larger than that of the second liquid.

4. The developing method according to claim 1, wherein a viscosity of the developer is larger than that of the second liquid.

5. The developing method according to claim 1, wherein a rotational speed of the substrate is between 250 rpm and 3000 rpm.

6. The developing method according to claim 1, wherein before the developer and the second liquid are simultaneously supplied, there is provided a step in which the second nozzle is moved to a position above the central part of the substrate, and the second liquid is supplied onto the substrate surface.

7. A developing method comprising a developing step in which, while a horizontally held substrate having a resist film formed thereon is being rotated, the substrate is developed by supplying a developer onto a surface of the substrate, wherein provided before the developing step is a pre-wetting step in which, simultaneously with the developer being supplied from a first nozzle that is located on a position near a central part of the surface of the rotating substrate having a resist film formed thereon, a second liquid is supplied from a second nozzle that is located on a position nearer to an outer peripheral part of the substrate than the first nozzle, and the first nozzle and the second nozzle are moved in a direction connecting the central part and the outer peripheral part of the substrate, to thereby spread out the developer in the rotating direction of the substrate by means of a wall that is formed by the second liquid flowing to the outer peripheral side of the substrate with the rotation of the substrate, wherein, in the pre-wetting step, the supply of the developer is initiated simultaneously with the supply of the second liquid.

8. The developing method according to claim 7, wherein the second liquid is a deionized water.

9. The developing method according to claim 7, wherein a surface tension value of the developer is larger than that of the second liquid.

10. The developing method according to claim 7, wherein a specific gravity of the developer is larger than that of the second liquid.

11. The developing method according to claim 7, wherein a viscosity of the developer is larger than that of the second liquid.

12. The developing method according to claim 7, wherein a rotational speed of the substrate is between 250 rpm and 3000 rpm.

13. The developing method according to claim 7, wherein before the developer and the second liquid are simultaneously supplied, there is provided a step in which the second nozzle is moved to a position above the central part of the substrate, and the second liquid is supplied onto the substrate surface.

* * * * *